United States Patent [19]

Moore et al.

[11] 4,316,161
[45] Feb. 16, 1982

[54] WIDEBAND LOW TRIPLE TRANSIT DELAY LINE

[75] Inventors: Robert A. Moore, Arnold; Robert N. Sundelin, Hanover, both of Md.

[73] Assignee: Westinghouse Electric Corp., Pittsburgh, Pa.

[21] Appl. No.: 185,043

[22] Filed: Sep. 8, 1980

Related U.S. Application Data

[63] Continuation of Ser. No. 56,372, Jul. 10, 1979, abandoned.

[51] Int. Cl.³ ........................ H03H 9/36; H03H 9/125
[52] U.S. Cl. ................................... 333/141; 333/143; 333/145
[58] Field of Search .............................. 333/141–145, 333/186–187; 310/311, 321–323, 328, 365, 366

[56] References Cited

U.S. PATENT DOCUMENTS

| | | | |
|---|---|---|---|
| 3,942,139 | 3/1976 | Cooper et al. | 333/143 |
| 4,099,147 | 7/1978 | McAvoy | 333/143 |
| 4,101,852 | 7/1978 | Epstein et al. | 333/186 X |
| 4,103,263 | 7/1978 | Weglein | 333/186 X |
| 4,242,653 | 12/1980 | Moore | 333/141 |

Primary Examiner—Marvin L. Nussbaum
Attorney, Agent, or Firm—R. M. Trepp

[57] ABSTRACT

Electroacoustic apparatus is described incorporating a substrate having a transducer on an upper surface and a transducer on a lower surface positioned for receiving bulk acoustic waves; substrate taper along with transducer geometry are combined to provide bulk acoustic signals in the near zone or Fresnel zone which provide for phase and amplitude cancellation of a triple transit signal.

The invention overcomes the problem of spurious triple transit signals in bulk mode acoustic delay lines for input signals having a wide bandwidth, such as an octave, and where the delay times are short such that the bulk acoustic wave remains in the near zone or the transition region between the near zone and far zone.

16 Claims, 14 Drawing Figures

FIG. 13

WIDEBAND LOW TRIPLE TRANSIT DELAY LINE

CROSS REFERENCE TO A RELATED APPLICATION

This is a continuation of application Ser. No. 056,372, filed July 10, 1979 now abandoned.

This application is herein cross-referenced to Ser. No. 037,070, filed May 8, 1979 in the name of Robert A. Moore, now U.S. Pat. No. 4,242,653, and assigned to the assignee herein which discloses electroacoustic apparatus comprising a substrate having a variable thickness and having a plurality of transducers on an upper surface and a plurality of transducers on a lower surface each positioned for receiving bulk acoustic waves from a respective transducer on the upper surface wherein the triple transit signal is suppressed by phase cancellation when the signals from the transducers on the lower surface are combined.

BACKGROUND OF THE INVENTION

1. Field of the Invention

This invention relates to electroacoustic apparatus, particularly to bulk mode acoustic delay devices.

2. Description of the Prior Art

In the prior art, multiple reflections from bulk acoustic waves in delay lines have caused undesirable output signals. A bulk mode acoustic delay line having a transducer at either end of a substrate provides a desired output signal after a bulk acoustic wave is generated and travels from the input transducer to the output and an undesired triple transit signal after the bulk acoustic wave is reflected at the output and travels back and forth through the delay line to the output again. The triple transit output causes an interference ripple in the bandpass of the delay line corresponding to the difference in the delay between the direct output and the triple transit output. The interference period for a triple transit output is $\Delta f = \frac{1}{2}\tau$ where $\tau$ is the delay time of the delay line. One example of a bulk acoustic delay device for delaying signals and for providing triple transit suppression is described in U.S. Pat. No. 4,099,147 issued on July 4, 1978, entitled "Bulk Acoustic Delay Device" by Bruce R. McAvoy and assigned to the assignee herein.

In U.S. Pat. No. 4,099,147 the input transducer aperture provides a predetermined diffraction in the bulk acoustic wave launched causing the bulk acoustic wave to spread laterally as it propagates through the medium. The bulk acoustic wave impinges upon a receiving transducer to provide a direct output. The bulk acoustic wave after traversing the delay line three times impinges upon the receiving transducer and an additional transducer spaced outwards to intercept only the triple transit wave. The triple transit output is attenuated due to a difference in the acoustic path lengths from the input to the two receiving transducers to provide a phase difference of the two received signals. Bulk acoustic waves traveling through the medium also exhibit path attenuation due to the distance the wave travels from the input transducer which also reduces the triple transit signal.

An alternate approach to provide triple transit suppression in a bulk acoustic delay line is described in a paper entitled "Wideband Microwave Acoustic Delay Line With Exceptionally Smooth Phase and Loss Response" by W. R. Sperry, E. P. Kirchner and T. M. Reeder, published in the Digest of the International Microwave Theory and Technique Symposium sponsored by the IEEE on May 17, 1971. In the paper, triple transit supression is enhanced by using an angled end face to place the null in a radiation pattern of the triple transit signal, launched at the input transducer aperture, at the position of the output transducer aperture. In other words, the beam axis of the bulk acoustic wave launched by the transducer is tilted or directed such that on the third transit the main beam energy misses the receiving transducer and only the side lobes are seen. The beam axis tilting approach is useful only where the input and output transducers are in the far zone relative to each other so that the acoustic beam is in the Fraunhofer field region at the output transducer.

The use of additional receiving transducers in a surface acoustic wave delay device to provide triple transit suppression by means of phase interference has been described in a paper entitled "Triple-Transit Suppression in Surface Acoustic Wave Devices" by M. F. Lewis, published in Electronic Letters, Volume 8, No. 23, pages 553-554 on Nov. 16, 1972. In FIG. 2, two dummy interdigital transducers are spaced an additional distance of $\pm \lambda/4$ to reflect back to the input transducer two signals which are $\pm 180°$ out of phase with the reflection of the wave from the output transducer. The reflected waves are canceled at the input transducer leaving no surface acoustic wave to be reflected by the input transducer to become the triple transit signal at the output transducer. Nulling the reflected signal at the input transducer will not provide triple transit suppression in bulk mode acoustic delay lines.

Another approach to reduce the triple transit signal is described in U.S. Pat. No. 3,942,139 issued Mar. 2, 1976 entitled "Broadband Microwave Bulk Acoustic Delay Device" by Herbert Warren Cooper and John de Klerk and assigned to the assignee herein. In U.S. Pat. No. 3,942,139 an input and output transducer are placed side by side on one surface of a substrate. A bulk acoustic wave is launched from the input transducer and travels through the substrate whereupon it is reflected by the lower surface and travels back impinging upon the area of the input and output transducers whereupon the output transducer generates a signal. The triple transit signal actually the double transit signal, travels back and forth through the substrate and impinges upon the output transducer. The double transit signal is attenuated by propagation loss in the substrate medium and by diffraction loss or spreading of the bulk acoustic wave which propagates far enough away from the input transducer to be in the Fraunhofer region.

However, if the desired delay is short, such as 200 nanoseconds, the bulk acoustic wave will travel 1.217 millimeters in the substrate medium such as quartz until impinging an output transducer. The beam spreading of the ultrasonic elastic wave is provided for after propagating a certain distance by making the aperture or width of one side of the transducer d small such that the relation $2d^2/\lambda$ is greater than distance L where L is the acoustical path distance that the bulk wave is in the Fresnel zone. The beam spreading may diverge at the angle $\alpha$ where $\sin \alpha = \lambda/2d$. In other words, diffraction occurs sooner and is increased in angle $\alpha$ as the dimension d for one side of the transducer is decreased.

The Fresnel zone extends from the input transducer approximately out to a distance L where $L = 2d^2/\lambda$ where d is the length of one side of the transducer for rectangular transducer and $\lambda$ is the wavelength of the ultrasonic elastic wave in a transmission medium. λ may be determined by the relationship λ=V/f where V is the velocity of the ultrasonic wave in the transmission medium and f is the frequency of the ultrasonic elastic wave. In the Fresnel zone, the bulk acoustic wave propagates away from the transducer maintaining a cross section corresponding to the transducer. In the Fraunhofer field region, the bulk acoustic wave appears to have originated from a single point instead of from the overall area of the transducer.

It is therefore desirable to provide electroacoustic apparatus for delaying signals and for providing wideband triple transit suppression in bulk acoustic delay lines about a predetermined center frequency.

It is further desirable to provide bulk acoustic wave delay lines that can delay signals of an extremely broadband width such as an octave bandwidth with triple transit suppression for delays of 0.5 microseconds or less.

It is further desirable to provide bulk acoustic wave delay lines having large input and output transducers which generate and receive bulk acoustic waves in the near or Fresnel zone and where the topology of the transducers have various acoustical path lengths therebetween causing phase and amplitude cancellation which reduces the triple transit signal.

SUMMARY OF THE INVENTION

In accordance with the present invention, electroacoustic apparatus is provided for delaying signals and for providing wideband triple transit suppression about a predetermined center frequency comprising a substrate having an upper and lower surface, the substrate comprised of material suitable for propagating bulk acoustic waves, a first transducer mounted on the upper surface for generating bulk acoustic waves toward the lower surface, a second transducer mounted on the lower surface and positioned for receiving bulk acoustic waves from the first transducer, the first and second transducers having a plurality of spacings between each other, and having a maximum spacing between themselves which is less than $2d^2/3\lambda$ where d is the maximum width of one side of the first transducer and λ is the wavelength of the ultrasonic elastic wave in the transmission medium at the predetermined center frequency.

The invention further provides electroacoustic apparatus for delaying signals and for providing wideband triple transit suppression about a predetermined center frequency comprising a substrate having an upper and lower surface in a region of varying thickness, the substrate comprised of material suitable for propagating bulk acoustic waves, a first transducer mounted on said upper surface for generating bulk acoustic waves toward the lower surface, a second transducer mounted on the lower surface and positioned for receiving bulk acoustic waves from the first transducer, said first and second transducers having first and second perimeters, respectively, said first and second transducers having an area within said perimeters sufficient to propagate bulk acoustic waves and to receive triple transit bulk acoustic waves in the Fresnel zone.

DESCRIPTION OF THE PREFERRED EMBODIMENT

Figure 1:
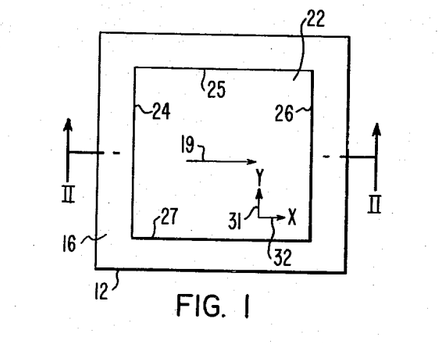
FIG. 1 is a top view of one embodiment of the invention.
Figure 2:
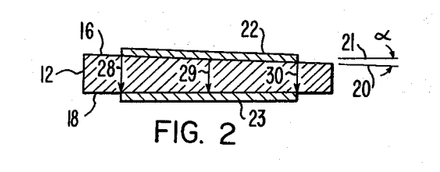
FIG. 2 is a cross section view along the lines II—II of FIG. 1.

Referring now to the drawings, FIGS. 1 and 2 show an electroacoustic apparatus 10 for delaying signals and for providing wideband triple transit suppression about a predetermined center frequency. A substrate 12 is shown having an upper surface 16 and a lower surface 18. Substrate 12 is comprised of material suitable for propagating bulk acoustic waves. By way of example, materials that would be suitable for substrate 12 are materials that are piezoelectric, nonpiezoelectric, insulating, semiconducting and conducting. The upper surface 16 and the lower surface 18 may be planar suitable for subsequent photolithic steps for fabricating the electrode patterns of transducers. The upper surface 16 may be at an acute angle and spaced apart from the lower surface 16 so as to provide a variation of thickness at various locations on the substrate for the transducers. Alternatively, the upper surface 16 may be irregular relative to the lower surface 18 to provide various thicknesses at various locations prior to depositing the transducers. In FIG. 1, the upper surface 16 is shown at an acute angle of α with respect to the lower surface 18. The direction along upper surface 16 to measure acute angle α is shown by arrow 19. In FIG. 2, reference line 20 is parallel to lower surface 18 and reference line 21 is colinear or parallel to upper surface 16. The angle α is measured between reference lines 20 and 21. The angle α is the maximum angle formed by the intersection of upper surface 16 with lower surface 18. Transducer 22 is shown mounted on upper surface 16 for generating bulk acoustic waves toward the lower surface 18. Transducer 23 is mounted on lower surface 18 and positioned for receiving bulk acoustic waves from transducer 22 on the upper surface 16. The perimeter of transducer 22 is formed by straight line segments 24 through 27 which have equal lengths and are coupled in a closed loop to form a square as shown in FIG. 1 but may be rectangular as well. Transducer 23 likewise has a perimeter of straight line segments which are equal in length and connected in a closed loop to form a square as shown in FIG. 1 but may be rectangular as well if transducer 22 is. The perimeter of transducer 23 is aligned with the perimeter of transducer 22 so that the area of transducer 22 is above the area of transducer 23.

Figure 3:
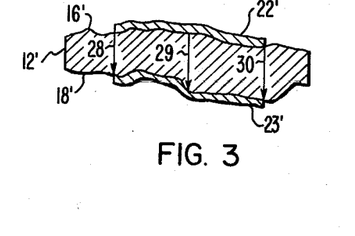
FIGS. 3 and 4 are a cross section view along the lines II—II of FIG. 1 for alternate embodiments of FIG. 1.
Figure 4:
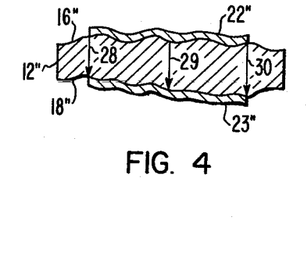

Transducers 22 and 23 have a plurality of spacings between each other due to the non-uniform of variable thickness of substrate 12. For example, arrows 28, 29 and 30 shown in FIG. 2 may have a spacing of L1, L2 and L3 respectively, which correspond to the acoustical path length for a bulk acoustic wave at these locations. As shown in FIG. 2, the various path lengths or spacings are caused by the upper surface 16 being at an angle α with respect to lower surface 18. Alternatively, these spacings could be caused by varying random or periodic thicknesses such as shown in FIGS. 3 and 4. The non-uniform thicknesses may occur in both X and Y directions, as shown by arrows 31 and 32 in FIG. 1. Arrow 32 is parallel with arrow 19 and orthoganol to arrow 31.

Transducers 22 and 23 have a maximum spacing between themselves such as at arrow 28 which is less than $2d^2/\lambda 3$ where d is the width of one side of transducer 22 such as the length of line segment 25 and $\lambda$ is the wavelength of the ultrasonic elastic wave in the transmission medium at a predetermined center frequency.

FIGS. 3 and 4 are a cross section view along the lines II—II of FIG. 1 for alternate embodiments. In FIG. 3 the thickness of substrate 12' varies in a non-periodic form over an area having a transducer 22' on upper surface 16' and transducer 23' mounted on lower surface 18'. Arrows 28, 29 and 30 are shown having varying lengths L1, L2 and L3 respectively. Likewise, FIG. 4 shows substrate 12" having an upper surface 16" with transducer 22" mounted thereon. Lower surface 18" has a transducer 23" mounted thereon. Arrows 28, 29 and 30 have varying lengths L1, L2 and L3 respectively. FIG. 4 represents a substrate 12" having a periodic non-uniform thickness over an area. The perimeters of transducers 22' and 22" may also be irregular or they may be of a well known geometric shape. Likewise transducers 23' and 23" are positioned and of a shape to have a similar perimeter as transducer 22' or 22", respectively.

Figure 5:
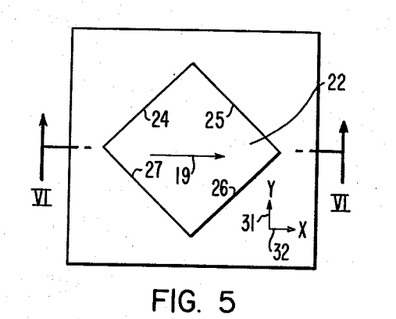
FIG. 5 is a top view of an alternate embodiment of the invention.
Figure 6:
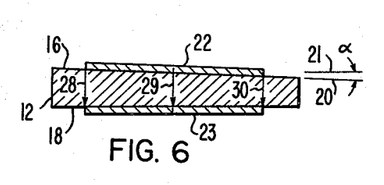
FIG. 6 is a cross section view along the lines VI—VI of FIG. 5.

FIGS. 5 and 6 show an alternate embodiment of the invention having substrate 12 with the upper surface 16 and the lower surface 18 in a direction of maximum angle, bevel, or taper indicated by arrow 19 and where upper surface 16 forms an acute angle with lower surface 18 indicated by the angle α between reference lines 21 and 20. In FIGS. 5 and 6 like references are used for functions corresponding to the apparatus of FIGS. 1 and 2.

In FIG. 5 transducer 22 is oriented such that one diagonal between the square corners of transducer 22 are parallel with arrow 19. Transducer 23 is likewise aligned with transducer 22 with one diagonal between corners of transducer 23 parallel with arrow 19.

Figure 7:
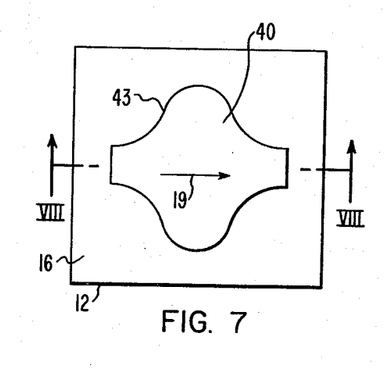
FIG. 7 is a top view of an alternate embodiment of the invention.
Figure 8:
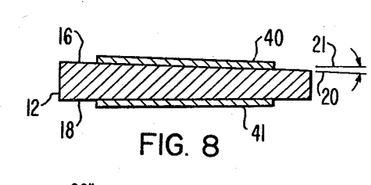
FIG. 8 is a cross section view along the lines VIII—VIII of FIG. 7.

FIGS. 7 and 8 show an alternate embodiment of the invention where like references are used for functions corresponding to the apparatus of FIG. 1. In FIGS. 7 and 8 transducer 40 is shown mounted on the upper surface 16. Transducer 41 is mounted on lower surface 18 and is positioned below transducer 40 to receive bulk acoustic wave energy. Transducer 40 has a perimeter 43 which has a predetermined geometric shape and a variable spacing of angle α from transducer 41. The bulk acoustic wave generated by transducer 40 propagates in the near zone as it travels to transducer 41 resulting in amplitude weighting and predetermined side lobes of the outputs signal at transducer 41 compared to the input signal at transducer 40.

Substrate 12 has a spacing that is sufficiently close between the upper and lower surface such that incremental elements of transducer 23 in FIGS. 2 and 6 and transducer 41 in FIG. 8 are in a near zone relative to the bulk acoustic wave launched by transducer 22 or 40 respectively. Even though substrate 12 has a larger spacing such that the transducers 22 and 23 or 40 and 41 are moderately separated, the individual or incremental elements of the aperture may be between the near and far zones even though the transducer as a whole is in the near zone. If the bulk acoustic wave at the receiving transducer is in the region between the near and far zones, then the reception of the bulk acoustic wave as a whole by the transducer can be determined taking into account the incremental element diffraction effects.

When the sending and receiving transducers of a delay line are in the far zone or Fraunhofer region relative to each other, the beam is completely formed and the energy sensed at the receiving transducer for every point on the receiving transducer is a result of integration over the total sending transducer; that is, the sending transducer appears to be a point source to the receiving transducer. The energy received at the receiving transducer is essentially uniform over the entire surface, both in amplitude and phase. The receiving transducer serves only as a gatherer of acoustic energy and the amount of energy it receives is essentially proportional to its area. The area of the receiving transducer then is determined by both its gathering capability and matching circuit parameters.

When the sending and receiving transducers are in the near zone or Fresnel zone, relative to each other, the bulk acoustic wave does not appear to have originated from a point source but rather from incremental elements of the sending transducer. Incremental cross sections of the bulk acoustic wave therefore correspond in phase and amplitude to incremental elements of the sending transducer. The phase and amplitude at various points of a bulk acoustic wave having traveled the same acoustical path length may be considerably varied from other points at the same cross section area. Further, the incremental elements of the receiving transducer are no longer excited by the complete transmitting transducer appearing as a point source, but only a small portion of the transmitting or sending transducer. Thus, it is not possible for the geometry of the transmitting transducer to provide for the energy of the main beam to miss the receiving transducer on the third transit as is possible when the transducer is in the far zone where a beam has been completely formed. Thus, triple transit or multiple transit cancellation can occur for transducers in the near zone only if there is an integrated phase-amplitude cancellation across the aperture of the bulk acoustic wave energy collected by the receiving transducer. Thus, whereas in the far zone each point on the receiving transducer views a complete transmitting transducer as a point source, and each point on the receiving transducer receives the integrated transmission of the transmitting transducer in that direction. For transmission in the near zone, the integration at the receiving transducer is accomplished by the receiving transducer as a whole. Each point on the receiving transducer views only a small area of the cross section of the bulk acoustic wave corresponding to a small area or incremental element of the transmitting transducer.

Figure 10:
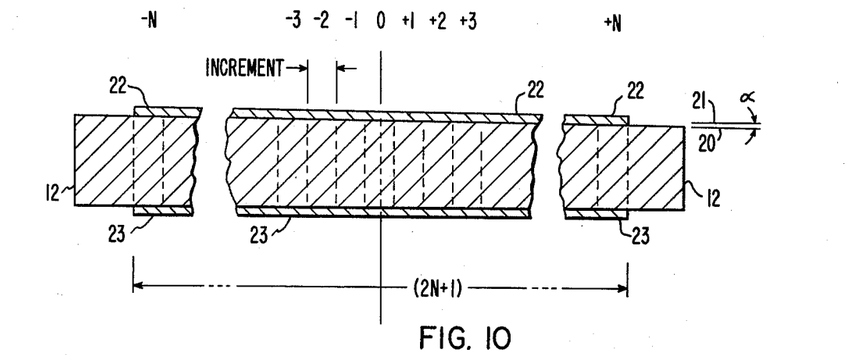
FIG. 10 is a cross section along the lines II—II of FIG. 1.

FIG. 10 shows substrate 22 divided into increments $-N$ through $+N$ for a total of $2N+1$ increments. An increment has a unit width of substrate 12 transverse the substrate 12. The substrate thickness will vary by a unit thickness δ per unit and a total thickness variation Δ of $(2N+1)\delta = \Delta$ under transducer 22. In FIGS. 10, 11, 13, and 14 like references are used for functions corresponding to the apparatus of FIG. 1.

The summation of the bulk acoustic wave at transducer 23 assuming the wave is in the near zone is given by equation (1) where $\beta$ is the propagation constant $2\pi/\lambda = W/N$ where $\lambda$ is the wavelength of the bulk acoustic wave, W radian frequency and V is the velocity in the medium $$\Sigma = e^{-iN\beta\delta} + e^{-i(N-1)\beta\delta} \ldots e^{-i\beta\delta} + 1 + e^{i\beta\delta} \ldots + e^{i(N-1)\beta\delta} + e^{iN\beta\delta} \quad (1)$$

After normalization and where $\beta\delta$ is sufficiently small equation (1) may be expressed as equation (2)

$$\Sigma = \frac{\sin \frac{(2N+1)}{2} \beta\delta}{\frac{(2N+1)}{2} \beta\delta} \quad (2)$$

Figure 12:
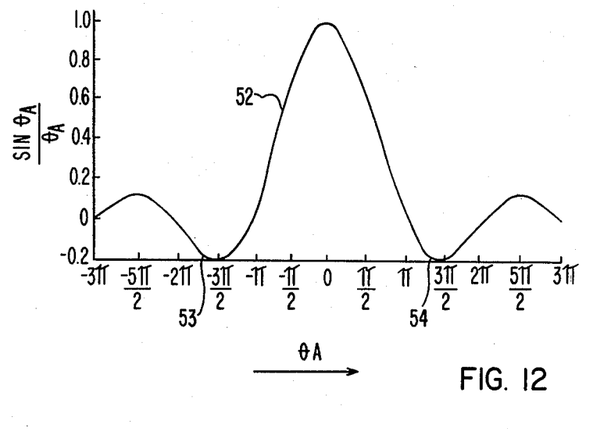
FIG. 12 is a graph showing the pattern transform sin $\theta_A/\theta_A$ versus $\theta_A$.

Since $(2N+1)\delta = \Delta$, nulls in the radiation pattern arriving at transducer 23 occur when $(2N+1)/2\beta\delta = \beta\Delta/2 = \pm h\pi$ as shown by curve 52 in FIG. 12.

Figure 11:
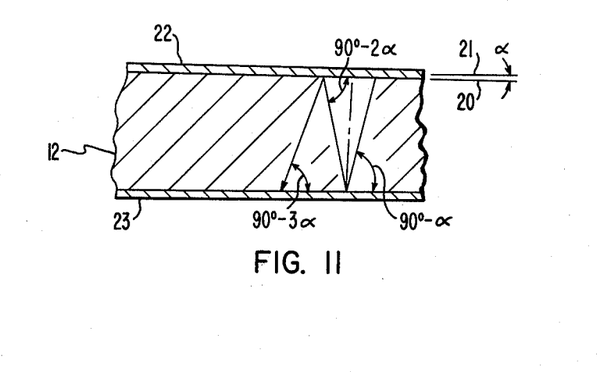
FIG. 11 is a portion of FIG. 10 enlarged.

Because the angle of arrival is 3 times the bevel angle as shown in FIG. 11, the triple transit null occurs when the bevel angle $\alpha$ is $\frac{1}{3} \theta_A$ or when $\beta\Delta/2 = \pi/3$ or $\Delta = 2\pi/3\beta = 2\pi\lambda/3.2\lambda = \lambda/3$. The bevel angle, $\alpha = \sin^{-1} \Delta/W = \lambda/3 W$ where W is the width of the transducer.

Total triple transit suppression is the sum of suppression due to propagation loss ($L_{TTP}$) and that due to transducer cancellation ($L_{Tr}$) where:

$L_{TT} = L_{TTP} + L_{Tr}$ $L_{TTP}$ is suppression due to propagation $L_{TTP} = 2$ times the loss due to propagation alternation because triple transit must travel over the propagation path two times the first transit (total of three times)

Typically $L_P$ is 5 db so $2L_p$ is 10 db. Thus to achieve 20 db TT suppression, $L_{Tr}$ must be 10 db. Similarly, to achieve 30 db $L_{Tr}$ must be 20 db.

The transform sin x/x provides a main lobe and sidelobe. The first transit arrives at the secondary transducer within the main lobe (at the bent angle from perpendicular). Since the triple transit arrives at $3\alpha$ the bevel can be designed such that the TT arrives in the first null or further out.

Since the time form sin x/x provides 13 db sidelobes, the worst case suppression is 13 db as shown by curve portion 53 and 54 in FIG. 12. However, by operation off the sidelobe peak, it can be much greater.

Figure 13:
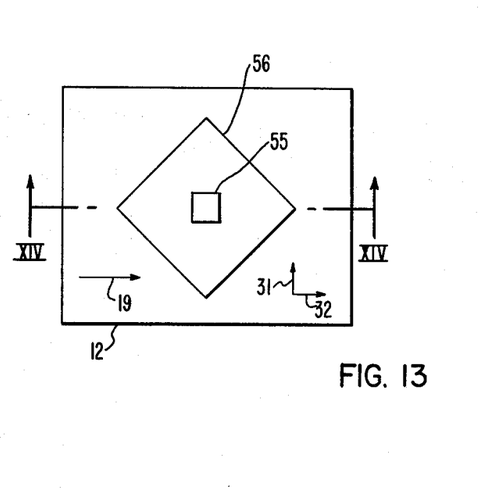
FIG. 13 shows an alternate embodiment of the invention.
Figure 14:
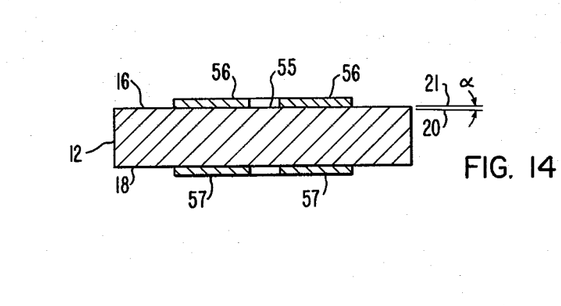
FIG. 14 shows a cross section along the lines XIV—XIV of FIG. 13.

Greater suppression is achieved by using other apertures as shown in FIG. 5. By beveling on the diagonal of the transducer the sidelobes are 26 db. This is because there is a sin x/x type pattern in both broadside dimensions. Because the bevel is 45⁰ to each axis, the bevel angle in $\sqrt{2}$ that of a broadside bevel for the same off axis position for triple transit suppression. Thus, $$\alpha = \sin^{-1} \frac{\sqrt{2} \lambda}{3W}$$

Where the peak sidelobe is defined as the maximum triple transit, it is desirable to reduce these peaks still further. One way is to make the two broadside dimensions different so that the peak of one falls in the null of the other. This provides an added 6 lb. minimum suppression since the 3 db points of the two sidelobe structure can be made to cross. Though this degree of tracking will only occur for the first few sidelobes, this is sufficient for even octave bandwidth lines. Another approach pictured in FIGS. 13 and 14 show a small rectangular void 55 at the center of the transducer 56. The void or enclosed open area 55 subtracts because it is a void from the complete range $\theta_A$ of the transform pattern because with the small aperture its pattern is very broad. The result is a sidelobe reduction of 6 db or $-32$ db sidelobes. Transducer 57 has the same geometry as transducer 56 and is aligned on lower surface 18.

The triple transit reduction from any one of three patterns is calculated as follows: For an octave bandwidth the triple transit impinges on the secondary transducer such that the transform pattern is between $\pi$ and $2\pi$. For the first transit the transform pattern is between $\pi/3$ and $2\pi/3$. For this range of angles the maximum loss to the first transit is 7.4 db. Thus the net transducer cancellation of triple transit for the best pattern described in $32 - 7.4 = 24.4$ db.

A publication by Frederick J. Harris entitled "On The Use of Windows For Harmonic With The Discrete Forms Transits," Proc. IEEE, Vol. 66, No. 1, pp. 51–83; January 1978 discloses in Table I at page 55 additional pattern transforms with their sidelobe levels which would be applicable to the invention herein to determine transducer geometry in place of the sin x/x transform and the rectangle geometry.

If the transducers are sufficiently close together such that the receiving transducer is in the near zone, the computation of the coupling between the sending and receiving transducer is as straight forward as in the far zone. In the near zone it can be assumed that only elements opposite each other of the sending and receiving transducers communicate with each other so that the total transmission of a bulk acoustic wave is the integral of the transmissions between the incremental elements opposite each other. Thus, the transmission is the Fourier transform integrated over the coupled pairs of elements of the transmitting and receiving transducers. It is thus, straight forward to compute the transform, for example, with a slight bevel on the transducer surfaces or at a slight angle between the upper and lower surface of the substrate. The phase cancellation of the triple transit signal can be achieved in the near zone equivalent to the phase cancellation of the far zone beam. For example, with a substrate having a bevel or angle of one surface relative to the other, for a rectangular aperture, the input signal would lead to an output signal with beveled angular side lobes which are 13 decibels down from the main lobe. If the two transducers, sending and receiving, are arranged so that the axes of the bevel as indicated by arrow 19 pass through the diagonal or corners of the square transducer as shown in FIG. 6, the side lobes would be 26 decibels down from the main lobe. In the arrangement of FIG. 6, the transform appears as the product of two sin x/x patterns. The arrangement in FIG. 1 has the transmission characteristic of a sin x/x pattern. These examples of transducer aperture geometry have been used for far zone, triple transit suppression and are applicable to genuine near zone triple transit suppression.

FIG. 8 has a transducer geometry as shown by perimeter 43 which is aligned relative to arrow 19 showing the direction of bevel or maximum angle between upper surface 16 and lower surface 18. The geometry of transducer 40 results in a transform of bulk acoustic waves emitted by transducer 40 and received by transducer 41 of a cosine² on a pedestal. From a transducer, the transmission is the patterns transform taken for the coupled pairs of incremental elements of the transmitting and receiving transducers. Other useful apertures can be utilized and as a matter of fact amplitude weightings common to other forms of technology such as antennas, can immediately be applied to transducer design such as Taylor, Kaiser Bessel, cosine² on a pedestal and the like. Thus, transducer pairs with these forms of waiting can be immediately applied and would be useful to provide triple transit suppression of major amounts for reasonable broad bandwidths.

FIG. 1, FIG. 5 and FIG. 7 illustrate the progression from a square rectangular transducer through the diamond shaped transducer to the cosine² on pedestal weighting of near zone transducers, for triple transit suppression. It should be noted that if interference triple transit suppression is used with either rectangular apertures or any of the more sophisticated weightings, that the receive transducer does not integrate fully in phase the bulk acoustic wave received on the first transit. Typical degradations to the first transit are in the neighborhood of 4 to 5 decibels. This is a small degradation to obtain 30 or more decibels of triple transit and higher order suppression.

A further consideration is for the case when the separation between the receiving and sending transducers is sufficient that opposite incremental elements of the sending and receiving transducer do not directly communicate, but rather communicate with greater area than just the points directly opposite themselves. When separations are at this level, they are in the region between the near and far zone where forms of diffraction can occur which must be accounted for in the computation and design of the transducers.

Considerable analysis has been carried out on geometries in which portions of the apertures are sufficiently small so that the two apertures are within the near zone, the separate portions of the apertures are not. In these cases it has been largely found that diffraction affects are negligible and the aperture can be treated as a total aperture rather than the individual part. Thus, the arrangement of the transducers in FIGS. 1, 5 and 7 have total transducers that are in the near zone relative to each other even though the incremental elements of the transducers opposite each other are perhaps beyond the near zone. The transducers operate as near zone transducers. Therefore, all forms of weighting by selecting transducer geometry are applicable to transducers on beveled surfaces to achieve low angular side lobe generation at the receiving transducer compared to the original signal at the input and at the same time achieve triple transit suppression.

Figure 9:
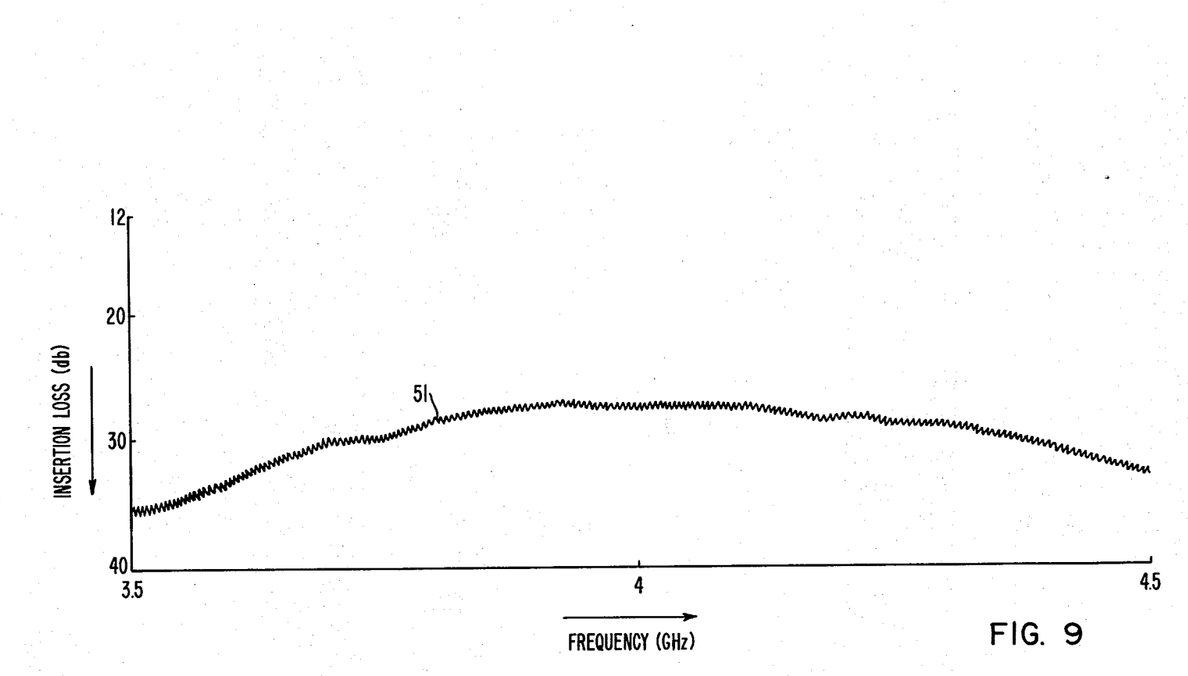
FIG. 9 is a graph showing the bandpass characteristic which indicates the wideband triple transit suppression versus frequency of the embodiment in FIG. 1.

FIG. 9 is a graph showing the bandpass characteristic which indicates the wideband triple transit suppression versus frequency of the embodiment in FIG. 1 except that the transducer geometry is a rectangle. Transducers 22 and 23 in rectangular form would have a dimension of 0.1016 millimeters on one side and 0.2032 on the other side. Substrate 12 is 1.217 millimeters thick and angle α is 7'. The substrate material is single crystal quartz arranged with propagation in the x direction in the quartz which is orthoganol to x and y coordinates shown by arrows 32 and 31 in FIG. 1 and orthoganol to the upper surface 16 or substantially orthoganol. The delay caused by propagation through substrate 12 is 200 nanoseconds. In FIG. 9 the ordinate represents insertion loss in decibels and the abscissa represents frequency.

Curve 51 shows the signal received at transducer 23 after a bulk acoustic wave generated by transducer 22 has transversed substrate 12. The small sawtooth fluctuations on curve 41 are caused by the input signal coupling through from transducer 22 to transducer 23 which is termed leakage and by the bulk acoustic wave after transversing substrate 12 three times. At the center frequency in FIG. 9, the insertion loss is 27 decibels, the leakage is suppressed about 63 decibels below the level of the input signal, and the triple transit signal is suppressed about 59 decibels below the level of the input signal. As can be seen in FIG. 9, curve 51 extends from 3.5 gigahertz to 4.5 gigahertz with the suppression, as indicated by the amplitude of the sawtooth, comparable to the midband or center frequency at 4 gigahertz.

The invention provides for functional weighting of the apertures of the sending and receiving transducers of bulk acoustic waves in the near zone by utilizing various geometries to provide extremely low angular low side lobes and thereby provide triple and higher order transit suppression over wide bandwidths utilizing a substrate having a slight bevel or taper.

The invention further provides electroacoustic apparatus for delaying signals and for providing wideband triple transit suppression about a predetermined center frequency comprising a substrate having an upper and lower surface, the substrate comprised of material suitable for propagating bulk acoustic waves, a first transducer mounted on the upper surface for generating bulk acoustic waves toward the lower surface, a second transducer mounted on the lower surface and positioned for receiving bulk acoustic waves from the first transducer, the first and second transducers having a plurality of spacings between each other, and having a maximum spacing between themselves which is less than $2d^2/3\lambda$ where d is the maximum width of one side of the first transducer and $\lambda$ is the wavelength of the ultrasonic elastic wave in a transmission medium at the predetermined center frequency.

We claim:

1. Electroacoustic apparatus for delaying signals and for providing wideband triple transit suppression about a predetermined center frequency comprising:
    a substrate having an upper and lower surface, said substrate comprised of material suitable for propagating bulk acoustic waves,
    a first transducer mounted on said upper surface for generating bulk acoustic waves toward said lower surface,
    a second transducer mounted on said lower surface and positioned for receiving bulk acoustic waves from said first transducer,
    said first and second transducers having a plurality of spacings between each other, and having a maximum spacing between themselves which is less than $2d^2/3\lambda$ where d is the maximum width of one side of said first transducer and $\lambda$ is the wavelength of the ultrasonic elastic wave in the transmission medium at said predetermined center frequency.

2. The electroacoustic apparatus of claim 1 wherein said first transducer encloses an open area of a predetermined geometric shape.

3. The electroacoustic apparatus of claim 1 wherein said upper and lower surfaces of said substrate are planar and are spaced apart at an acute angle.

4. The electroacoustic apparatus of claim 1 wherein said upper surface is spaced irregular relative to said lower surface to provide various thicknesses at various locations.

5. The electroacoustic apparatus of claim 1 wherein said upper surface is spaced random relative to said lower surface.

6. The electroacoustic apparatus of claim 1 wherein said upper surface is spaced periodic relative to said lower surface.

7. The electroacoustic apparatus of claim 3 wherein said first transducer has the shape of a square having one side oriented in the direction of maximum acute angle between said upper and lower surfaces.

8. The electroacoustic apparatus of claim 7 wherein said second transducer has the shape of a square of the same area as said first transducer having its perimeter aligned below the perimeter of said first transducer.

9. The electroacoustic apparatus of claim 3 wherein said first transducer has the shape of a square having one diagonal between the square corners oriented in the direction of maximum acute angle between said upper and lower surfaces.

10. The electroacoustic apparatus of claim 9 wherein said second transducer has the shape of a square of the same area as said first transducer having its perimeter aligned with and below the perimeter of said first transducer.

11. The electroacoustic apparatus of claim 1 wherein said first transducer has a perimeter which has a predetermined geometric shape.

12. The electroacoustic apparatus of claim 11 wherein said second transducer has the shape and area of said first transducer having its perimeter aligned with and below the perimeter of said first transducer.

13. The electroacoustic apparatus of claim 3 wherein said first and second transducers have a perimeter of a predetermined geometric shape to provide a transform of bulk acoustic waves emitted by said first transducer and received by said second transducer of a $\cosine^2$ on a pedestal.

14. The electroacoustic apparatus of claim 9 wherein said first transducer further includes an open area interior of said first transducer of a predetermined geometric shape.

15. The electroacoustic apparatus of claim 14 wherein said predetermined geometric shape is a square having one side oriented in the direction of maximum acute angle between said upper and lower surfaces.

16. The electroacoustic apparatus of claim 2 wherein said predetermined geometric shape is a square.

* * * * *